United States Patent [19]

Goto et al.

[11] Patent Number: 5,652,184
[45] Date of Patent: Jul. 29, 1997

[54] METHOD OF MANUFACTURING A THIN SEMICONDUCTOR PACKAGE HAVING MANY PINS AND LIKELY TO DISSIPATE HEAT

[75] Inventors: Masao Goto, Yokohama; Morihiko Ikemizu, Kawasaki, both of Japan

[73] Assignee: Kabushiki Kaisha Toshiba, Kawasaki, Japan

[21] Appl. No.: 434,707

[22] Filed: May 4, 1995

Related U.S. Application Data

[62] Division of Ser. No. 172,186, Dec. 23, 1993, Pat. No. 5,442,232.

[30] Foreign Application Priority Data

Dec. 28, 1992 [JP] Japan ................................ 4-348663

[51] Int. Cl.⁶ .................................................. H01L 21/60
[52] U.S. Cl. ........................... 437/209; 437/218; 437/902
[58] Field of Search ................................. 437/902, 218, 437/209; 257/701, 675, 706, 784

[56] References Cited

U.S. PATENT DOCUMENTS

| | | | |
|---|---|---|---|
| 4,943,844 | 7/1990 | Oscilowski et al. | 257/701 |
| 4,965,660 | 10/1990 | Ogihara et al. | 257/722 |
| 5,098,864 | 3/1992 | Mahulikar | 437/221 |
| 5,202,288 | 4/1993 | Doering et al. | 437/902 |
| 5,223,130 | 6/1993 | Nishino | 257/701 |
| 5,227,662 | 7/1993 | Ohno et al. | 257/668 |
| 5,254,500 | 10/1993 | AuYeung | 437/902 |
| 5,311,060 | 5/1994 | Rostoker et al. | 257/675 |
| 5,359,222 | 10/1994 | Okutomo et al. | 257/691 |

FOREIGN PATENT DOCUMENTS

| | | | |
|---|---|---|---|
| 488783 | 6/1992 | European Pat. Off. | 257/675 |
| 2-278856 | 11/1990 | Japan . | |
| 3-62533 | 3/1991 | Japan | 257/668 |
| 3-123067 | 5/1991 | Japan . | |
| 3-125440 | 5/1991 | Japan | 257/675 |
| 3-263359 | 11/1991 | Japan . | |
| 4-179261 | 6/1992 | Japan | 257/668 |

Primary Examiner—John Niebling
Assistant Examiner—Michael S. Lebentritt
Attorney, Agent, or Firm—Finnegan, Henderson, Farabow, Garrett & Dunner, L.L.P.

[57] ABSTRACT

The present invention provides a semiconductor device. In the device of the present invention, a metal lead wire is mounted to one surface of a carrier tape. One end of the metal lead wire is connected to a semiconductor chip. A lead frame is mounted to one surface of a reinforcing plate. The other end of the metal lead wire is connected to one end of an inner lead wire. The semiconductor chip is mounted to one surface of the reinforcing plate having an open portion positioned in the tip portion of the inner lead. Further, the semiconductor chip is covered with a resin layer.

2 Claims, 6 Drawing Sheets

METHOD OF MANUFACTURING A THIN SEMICONDUCTOR PACKAGE HAVING MANY PINS AND LIKELY TO DISSIPATE HEAT

This is a division of application Ser. No. 08/172,186, filed Dec. 23, 1993 now U.S. Pat. No. 5,442,232.

BACKGROUND OF THE INVENTION

1. Field of the Invention

The present invention relates to a semiconductor device, particularly, a thin semiconductor device provided with a large number of pins, said device permitting an efficient dissipation of heat generated within a semiconductor chip, and to a method of manufacturing the same.

2. Description of the Related Art

Figure 1:
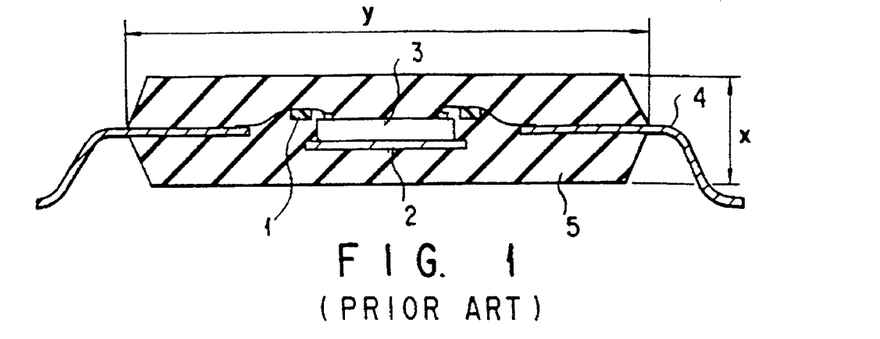
FIGS. 1 to 3 are cross sectional views each showing a conventional semiconductor device.
Figure 2:
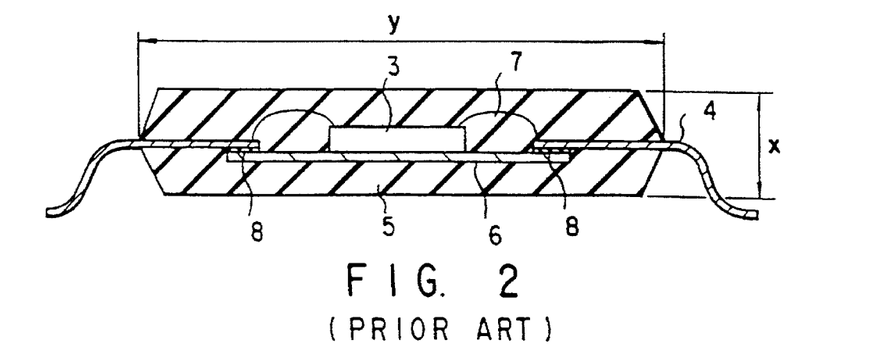
Figure 3:
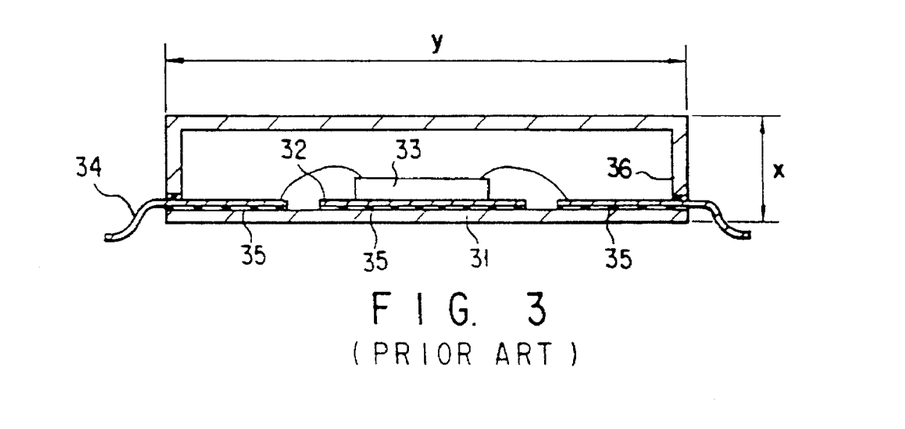

FIGS. 1 to 3 show conventional semiconductor devices provided with a large number of pins and having dimensions x=3.6 mm and y=32 mm. In the device shown in FIG. 1, a semiconductor device of a TAB structure is bonded to a lead frame and covered with a molding resin. To be more specific, the semiconductor device shown in FIG. 1 comprises a carrier tape 1, an island 2, a semiconductor chip 3, a lead frame 4, and a molding resin 5. The conventional device of this type is defective in that the island 2 has a small area, with the result that the heat generated in the semiconductor chip 3 is not dissipated efficiently.

A heat spreader structure of QFP is employed in the conventional device shown in FIG. 2. The semiconductor device of this type comprises a semiconductor chip 3, a lead frame 4, a molding resin 5, a heat spreader 6, a wire 7 and an adhesive 8. The device shown in FIG. 2 has a heat resistance lower than that in the device shown in FIG. 1.

However, the conventional devices shown in FIGS. 1 and 2 leave much room for further improvement. First of all, when it comes to, particularly, a semiconductor device provided with a large number of pins, the chip size is determined by the pitch of aluminum electrodes formed on the semiconductor chip. It should be noted in this connection that the semiconductor chip 3 is connected to the lead frame 4 by the wire 7, with the result that the area other than the semiconductor chip acting as an IC is increased, leading to an enlargement of the chip size and, thus, to an increased manufacturing cost.

A second problem to be noted is that the molding resin (enclosure) tends to be cracked in the step of mounting the semiconductor device to a printed circuit board by reflow. It should be noted that the bonding between the molding resin 5 and the heat spreader 6 is poor, with the result that water enters the clearance between the molding resin and the heat spreader. The water entering the particular clearance is evaporated by the heat in the mounting step of the semiconductor device to the printed circuit board so as to bring about the cracking noted above.

A third problem is that a satisfactory heat dissipation cannot be obtained in the conventional device because the semiconductor chip 3, the island 2 and the heat spreader 6 are surrounded by the molding resin 5. Incidentally, if the area of the heat spreader 6 is enlarged, the crack of the molding resin, i.e., the second problem noted above, is promoted. On the other hand, if the area of the heat spreader 6 is diminished, the heat dissipation is rendered poor.

What should also be noted is that the process for manufacturing the conventional semiconductor device necessitates the step of cutting a dam bar mounted to the lead frame before preparation of the final product (fourth problem). Incidentally, the dam bar is mounted for preventing a resin leakage because the resin layer is formed by the transfer molding.

The conventional device shown in FIG. 3 is of an M Quad structure. This device comprises a metal plate 31, an island 32, a semiconductor chip 33, a lead frame 34, an epoxy series adhesive 35, and a metal cap 36. The device shown in FIG. 3 is not covered with a molding resin. In addition, the metal plate 31 has a large area. It follows that the device exhibits a high heat dissipation. However, the metal plate 31 widely differs from the semiconductor chip 33 in the thermal expansion coefficient. As a result, a severe thermal fatigue is brought about when the device is subjected to heat cycles, giving rise to crack occurrence in the semiconductor chip 33. In other words, the metal plate 31 is not provided with any means for moderating the strain caused by the thermal expansion, giving rise to the crack occurrence. What should also be noted is that the metal plate 31 and the island 32 are bonded to each other with the epoxy series adhesive 35 interposed therebetween, with the result that the heat generated within the semiconductor chip 33 is not necessarily dissipated satisfactorily.

SUMMARY OF THE INVENTION

As described above, the conventional semiconductor device leaves room for further improvement. For example, the heat generated within the semiconductor chip is not dissipated efficiently. Also, cracking occurs in the enclosure in the mounting step of the semiconductor device to, for example, a printed circuit board. Further, the manufacture of the semiconductor device involves troublesome steps, leading to a high manufacturing cost.

The present invention, which has been achieved in an attempt to overcome the above-noted defects inherent in the prior art, is intended to provide a semiconductor device provided with a large number of pins, the device permitting efficiently dissipating the heat generated within a semiconductor chip, preventing the enclosure from being cracked by the reflow in the mounting step of the device to a printed circuit board, and making it possible to simplify the construction and the manufacturing process of the device so as to lower the manufacturing cost.

According to a first aspect of the present invention, there is provided a semiconductor device, comprising a carrier tape, a first lead wire mounted to the carrier tape, a semiconductor chip connected to one end of the first lead wire, a reinforcing plate on which one surface of the semiconductor chip is mounted, and a second lead wire mounted to one surface of the reinforcing plate and having the other end of the first lead wire connected to one end thereof.

According to a second aspect of the present invention, there is provided a semiconductor device, comprising a carrier tape, a lead wire mounted to the carrier tape, a semiconductor chip connected to one end of the lead wire, and a reinforcing plate having the semiconductor chip mounted on one surface thereof.

In the present invention, a semiconductor device of a TAB structure is mounted on a reinforcing plate. Also, a lead frame is mounted to the reinforcing plate. The particular construction permits efficiently dissipating the heat generated within the semiconductor chip, permits decreasing the thickness of the device, and also permits ensuring a sufficiently high mechanical strength of the device.

According to a third embodiment of the present invention, there is provided a method of manufacturing a semiconductor device, comprising the steps of:

connecting one end of a first lead wire formed on one surface of a carrier tape to a semiconductor chip;

mounting a second lead wire to one surface of a reinforcing plate having an open portion such that one end of the second lead wire is positioned in the open portion of the reinforcing plate; and connecting the other end of the first lead wire to the one end of the second lead wire by thermocompression bonding with a convex stage arranged to abut against the connecting portion between the first and second lead wires to release the heat into the open portion.

Further, according to a fourth aspect of the present invention, there is provided a method of manufacturing a semiconductor device, comprising the steps of:

connecting one end of a first lead wire formed on one surface of a carrier tape to a semiconductor chip;

connecting the other end of the first lead wire to one end of a second lead wire by thermocompression bonding; and mounting the semiconductor chip and the second lead wire to one surface of a reinforcing plate.

Since a semiconductor device of the present invention can be manufactured by simply connecting by thermocompression bonding the lead wire of a device of TAB structure to the lead wire of a reinforcing plate, the manufacturing cost of the device can be markedly lowered. Further, since a convex stage is allowed to abut against the connecting portion of these lead wires in the step of the thermocompression bonding, it is possible to obtain a semiconductor device of a high reliability with a high yield.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 4:
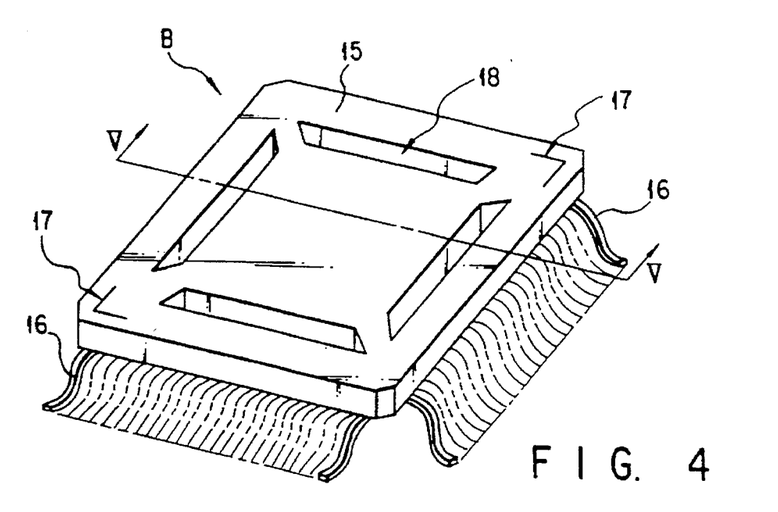
FIG. 4 is an oblique view showing a semiconductor device according to a first embodiment of the present invention.
Figure 5:
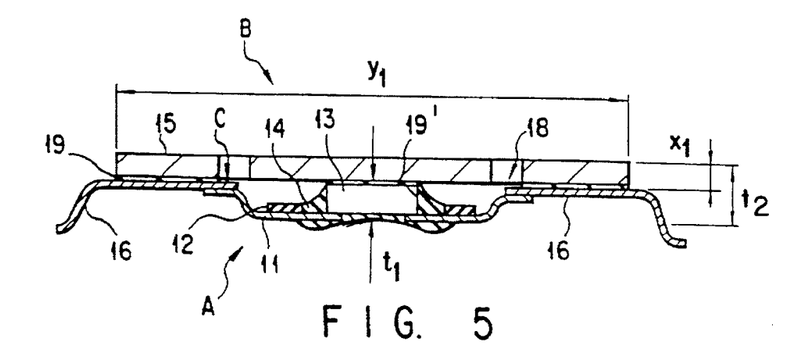
FIG. 5 is a cross sectional view along line V—V shown in FIG. 4.

FIGS. 4 and 5 collectively show a semiconductor device according to a first embodiment of the present invention; wherein FIG. 4 is an oblique view and FIG. 5 is a cross sectional view along line V—V shown in FIG. 4.

The semiconductor device of the present invention comprises a semiconductor chip section A and a reinforcing section B. The chip section A is formed of a semiconductor device of, for example, TAB structure. To be more specific, a metal lead wire 11 is formed on one surface of a carrier tape 12. A semiconductor chip 13 is connected to the metal lead wire 11. The metal lead wire 11 is bent toward the other surface of the carrier tape 12. The semiconductor chip 13 is covered with a liquid encapsulating resin (potting resin) 14. The semiconductor device has a thickness $t_1$ of about 0.45 mm in the portion of the semiconductor chip 13.

The reinforcing section B comprises a reinforcing plate 15 having a high heat conductivity and a lead frame 16 formed on one surface of the reinforcing plate 15. The reinforcing plate 15, which is thin and has a high mechanical strength, is formed of, for example, a metal or ceramic material, and is sized about, for example, 32 mm×32 mm×0.8 mm, where $y_1$=32 mm and $x_1$=0.8 mm. The size of the reinforcing plate 15 can be substantially equal to that of the conventional package.

A recognition mark 17 used for the recognition, positioning, etc. of the semiconductor device in the outer lead bonding (OLB) step is formed on the other surface of the reinforcing plate 15. The outer lead wire of the lead frame 16 is bent toward one surface of the reinforcing plate 15. Further, openings 18 are formed in the reinforcing plate 15.

The opening 18 is in the form of a slit and extends along a tip portion C of an inner lead of the lead frame 16 such that a convex stage can be positioned to abut against the tip portion C of the inner lead from the other side of the reinforcing plate 15. In the middle lead bonding (MLB) step in which the metal lead wire 11 in the semiconductor chip section A is connected to the lead frame 16 in the reinforcing section B, the convex stage is brought into contact with the tip portion C of the inner lead wire via the opening 18. As a result, the heat generated in the MLB step is efficiently dissipated through the convex stage. It follows that an adhesive 19 positioned between the reinforcing plate 15 and the lead frame 16 is not carbonized. Incidentally, the opening 18 is not necessary in terms of the manufacturing process in some cases, as described later.

The semiconductor chip 13 in the semiconductor chip section A is bonded to one surface of the reinforcing plate 15 in the reinforcing section B with an epoxy series adhesive 19' interposed therebetween. Also, the metal lead wire 11 in the chip section A is thermally fused to the inner lead of the lead frame 16 in the reinforcing section B. It should be noted that, when the chip section A is coupled to the reinforcing section B, the bending direction of the metal lead wire 11 is opposite to the direction in which the outer lead wire of the lead frame 16 is bent.

The particular construction described above permits the semiconductor device of the present invention to be provided with a large number of pins, to efficiently dissipate the heat generated within the semiconductor chip, and to be small in thickness.

To be more specific, the TAB technique utilized in the present invention permits the semiconductor device to be provided with as many as, for example, 304 pins. Also, the semiconductor chip 13 is mounted directly on the reinforcing plate 15 having a high heat conductivity, with the result that the heat generated in the semiconductor chip 13 is dissipated through mainly two routes, i.e., a route including the metal lead wire 11 on the carrier tape and another route including the reinforcing plate 15, leading to a marked improvement in the dissipation of the heat generated in the semiconductor chip. For example, if the reinforcing plate 15 is made of copper, a thermal resistance of 22° C./W (where °C. is centigrade degrees and W is watts) can be achieved in contrast to 42° C./W for the conventional semiconductor device shown in FIG. 1 and 29° C./W for the conventional semiconductor device shown in FIG. 2. Clearly, the particular construction of the present invention permits a marked improvement in the thermal resistance.

Further, the semiconductor device of the present invention shown in FIGS. 4 and 5 is sized about $y_1$=32 mm in width and about $t_2$=1.45 mm in thickness in contrast to the width of about y=32 mm and the thickness of about x=3.6 mm for each of the conventional semiconductor devices shown in FIGS. 1 to 3. In other words, the particular construction of the present invention permits markedly decreasing the thickness of the semiconductor device. What should also be noted is that the lead frame 16 (outer lead wire), which is tough, is connected to the reinforcing plate 15, with the result that the outer lead wire is unlikely to be bent.

To be more specific, where the device of TAB structure, i.e., semiconductor chip portion A, is mounted as it is to, for example, a printed circuit board, the metal lead wire 11 is connected directly to the printed circuit board. It should be noted in this connection that the metal lead wire 11 is as thin as about 30 μm and, thus, tends to be bent with a very small force. To overcome the difficulty, it is necessary to protect the metal lead wire 11 after the mounting step with, for example, a silicone resin.

In the present invention, however, the tough outer lead is connected to the reinforcing plate 15. The outer lead is tough, making it unnecessary to protect the outer lead with a silicone resin or the like.

The semiconductor device of the present invention produces additional effects. First of all, the semiconductor chip section A need not be protected excessively. In the conventional semiconductor device shown in FIG. 1, the carrier tape is exposed to the outside, making it necessary to protect the thin metal lead wire on the carrier tape by means of, for example, a transfer molding. In the present invention, however, the semiconductor chip section A is interposed between the reinforcing section B and the printed circuit board, making it unnecessary to protect the chip section A excessively. Also, dust is unlikely to be attached to the chip section A.

In the present invention, a recognition mark 17 used for the positioning of a semiconductor device in the outer lead bonding (OLB) step is formed on the other surface of the reinforcing plate 15, with the result that the semiconductor device can be positioned accurately without difficulty in the outer lead bonding step. It should be noted that, in the prior art, resin shrinkage takes place in the transfer molding step, making it impossible to form a recognition mark on the surface of the molding resin.

The semiconductor device shown in FIGS. 4 and 5 is manufactured as follows. In the first step, the semiconductor chip 13 is bonded to the metal lead wire 11 on the carrier tape 12 by the inner lead bonding technique and, then, covered with a liquid encapsulating resin. Further, the metal lead wire 11 is bent so as to form the semiconductor chip portion A. On the other hand, the lead frame 16 is bonded to the reinforcing plate 15 with an epoxy series adhesive, followed by applying plating to the lead frame 16 positioned on the reinforcing plate 15.

Figure 14:
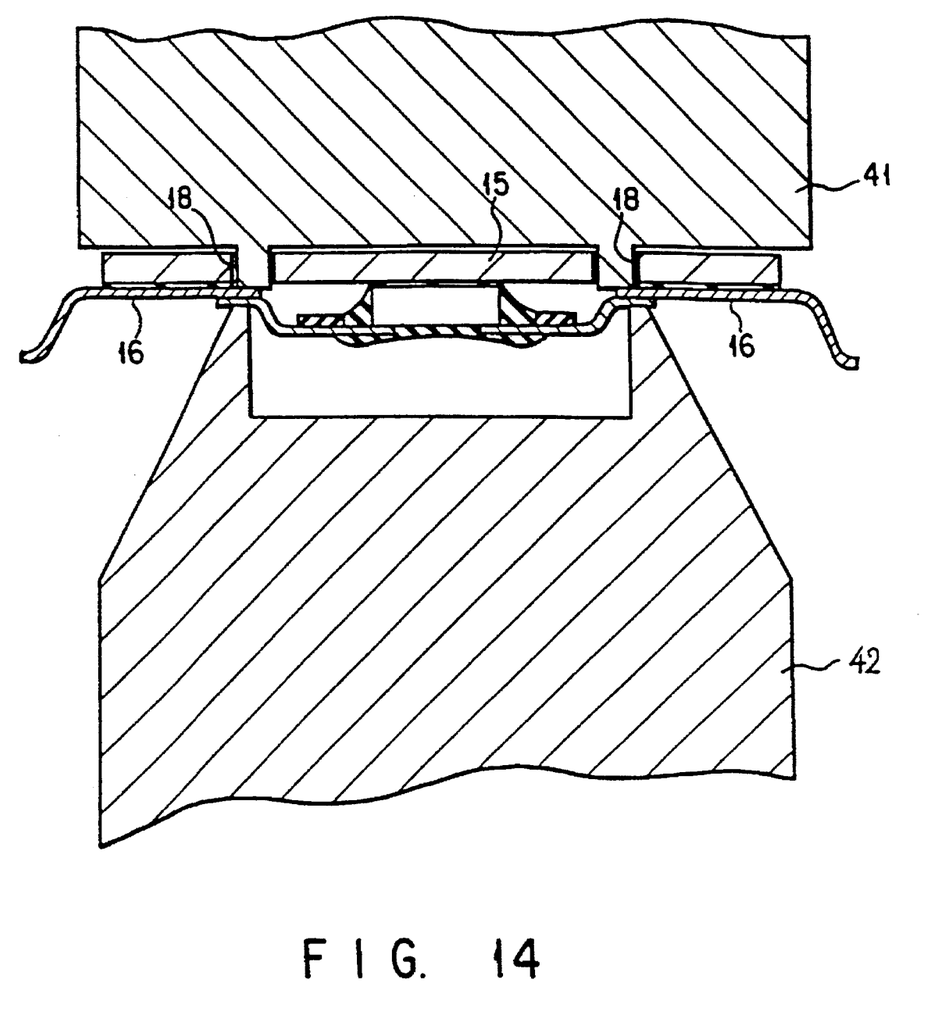
FIG. 14 is a cross sectional view showing a state that the middle lead bonding is provided.

In the next step, the metal lead wire 11 in the semiconductor chip portion A and the inner lead of the lead frame 16 included in the reinforcing portion B are bonded to each other (middle lead bonding; MLB) by thermocompression bonding. In this step, as shown in FIG. 14, a convex stage 41 is inserted from the other surface of the reinforcing plate 15 through the slit-like open portion 18 so as to bring the convex stage 41 into contact with the inner lead of the lead frame 16. As a result, the heat accompanying the thermocompression bonding, which is performed by using a bonding tool 42, is released to the outside through the convex stage 41. It follows that the carbonization of the adhesive inherent in the prior art does not take place in the present invention. Further, the semiconductor chip 13 and the reinforcing plate 15 are bonded to each other by the epoxy series resin.

The semiconductor device shown in FIGS. 4 and 5 can also be manufactured by another method. For example, the semiconductor chip 13 and the lead frame 16 can be simultaneously mounted to the reinforcing plate 15 after the middle lead bonding step. In this case, it is unnecessary to form the slit-like open portion 18. Then, the outer lead of the lead frame 16 is bent so as to manufacture the semiconductor device of the present invention.

The particular method of the present invention produces prominent effects. First of all, the dam-cutting step of the lead frame 16 and the debarring step, which are required in the conventional method of manufacturing a semiconductor device, are unnecessary in the present invention because a transfer molding step is not employed in the method of the present invention. In other words, a dam bar need not be mounted to the lead frame 16 in the method of the present invention. Also, it is possible in the present invention to apply a solder plating to the lead frame 16 before the middle lead bonding step, making it unnecessary to newly apply an external plating after the manufacture of the semiconductor device. It follows that the manufacturing process can be simplified, leading to a low manufacturing cost of the semiconductor device.

What should also be noted is that, in the middle lead bonding step which is carried out after the bonding of the lead frame 16 to the reinforcing plate 15, a convex stage can be inserted from the other side of the reinforcing plate 15 through the slit-like open portion 18 so as to bring the convex stage into contact with the outer lead wire of the lead frame 16. As a result, the adhesive is prevented from being carbonized in the middle lead bonding step, making it possible to manufacture a semiconductor device of a high reliability.

Figure 6:
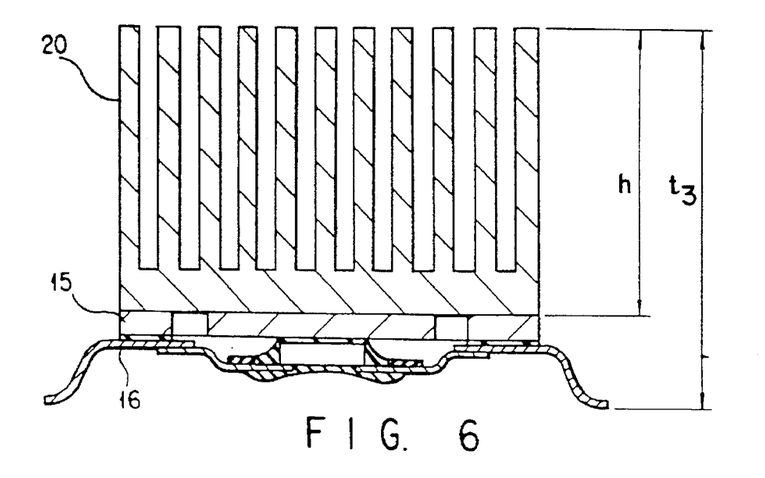
FIG. 6 is a cross sectional view showing a semiconductor device according to a second embodiment of the present invention.

FIG. 6 shows a semiconductor device according to a second embodiment of the present invention. The device shown in FIG. 6 is substantially equal to the semiconductor device shown in FIGS. 4 and 5, except that a heat dissipating fin 20 is mounted to the other surface of the reinforcing plate 15 in the device shown in FIG. 6 so as to further improve the heat dissipation from the semiconductor chip.

In the semiconductor device shown in FIG. 6, it is possible to determine appropriately the size of the heat dissipating fin 20 in accordance with the amount of the heat generation from the semiconductor chip 13, making it possible to manufacture various kinds of semiconductor devices, even if the number of semiconductor devices of the same kind is small. Where, for example, the semiconductor chip 13 mounted to the device has a heat generation of 10 W, it is effective to use the heat dissipating fin 20 with a convex portion having a height h of about 9 mm, e.g., wherein the total thickness $t_3$ of the device is, for example, about 10 mm. In this case, if the reinforcing plate 15 is formed of a copper plate, a thermal resistance of 13° C./W can be achieved.

Figure 7:
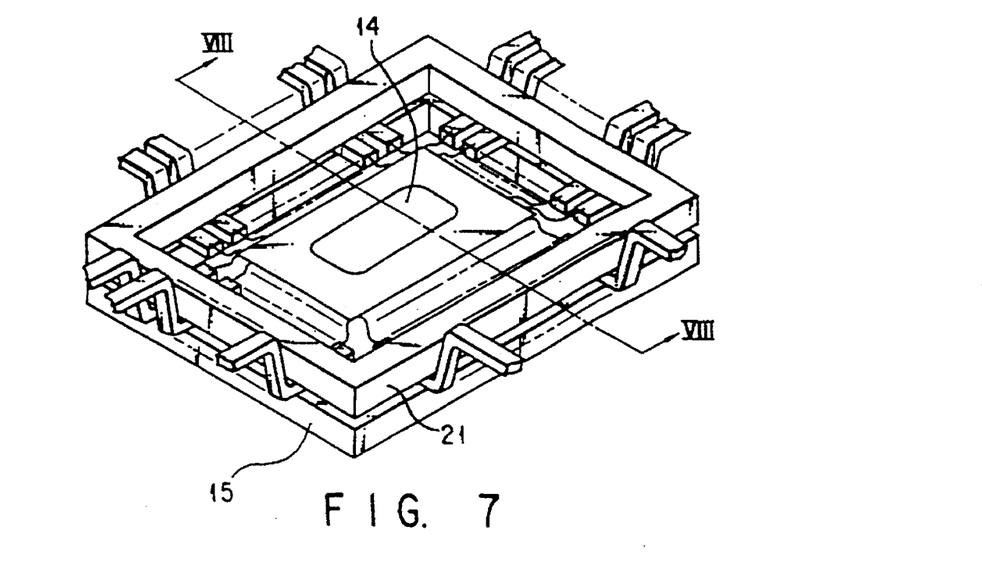
FIG. 7 is an oblique view showing a semiconductor device according to a third embodiment of the present invention.
Figure 8:
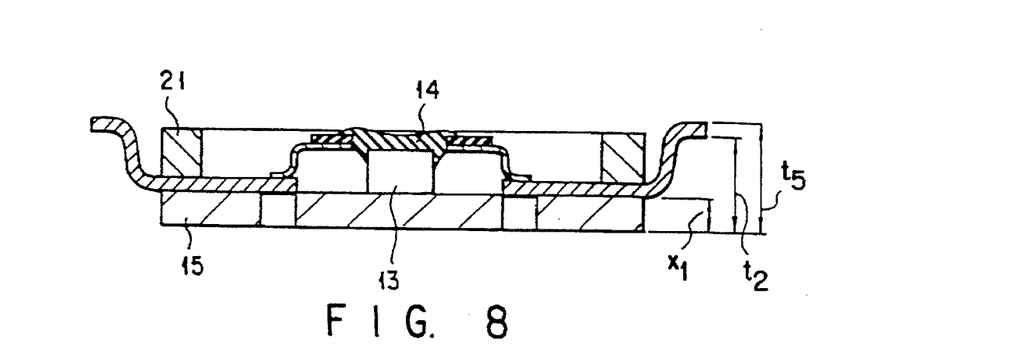
FIG. 8 is a cross sectional view along line VIII—VIII shown in FIG. 7.

FIGS. 7 and 8 collectively show a semiconductor device according to a third embodiment of the present invention, wherein FIG. 7 is an oblique view and FIG. 8 is a cross sectional view along the line VIII—VIII shown in FIG. 7. The device shown in FIGS. 7 and 8 is substantially equal to the semiconductor device shown in FIGS. 4 and 5, except that a protective frame 21 serving to protect the semiconductor chip portion A including the carrier tape portion and the middle lead bonding portion is mounted to one surface of the reinforcing plate 15 in the device shown in FIGS. 7 and 8. The protective frame 21 is arranged to surround the semiconductor chip 13 in an outer region of the middle lead bonding portion including the junction between the metal lead wire 11 and the lead frame 16. In other words, the semiconductor chip 13 is completely surrounded by a wall. The height h of the wall, i.e., the thickness of the protective frame 21, is set such that the height from the other surface of the reinforcing plate 15 to the upper surface opposite to the reinforcing plate 15 of the protective frame 21 is equal to or larger than the height from the other surface of the reinforcing plate 15 to the upper surface of a resin layer 14 included in the semiconductor chip portion A. In other words, the thickness of the protective frame 21 is equal to the value obtained by subtracting the thickness of the lead frame from the thickness ranging between the lower surface of the chip 13 and the upper surface of the resin layer 14. Further, the protective frame 21 should be sized, for example, equal to the size of the reinforcing plate 15 (32 mm×32 mm). Also, for example, the thickness $x_1$ of reinforcing plate 15 is 0.8 mm, and the semiconductor device shown in FIGS. 7 and 8 has a thickness $t_2$ of about 1.45 mm (measured to the bottom of lead frame 16) and a thickness $t_5$ of about 1.55 mm (measured to the top of lead frame 16).

The semiconductor device shown in FIGS. 7 and 8 can be manufactured with a high yield because the semiconductor chip portion A is protected by the protective frame 21.

Figure 9A:
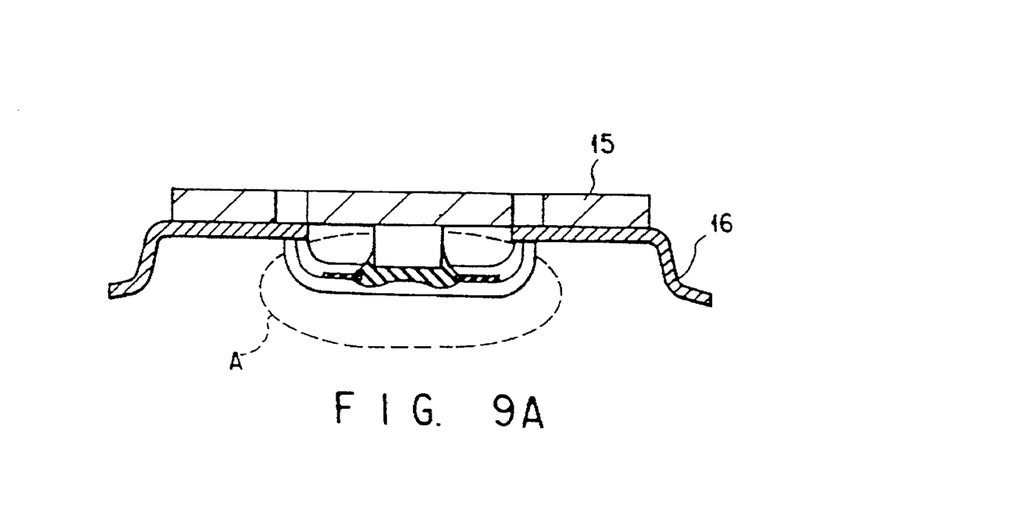
FIGS. 9A to 9C are cross sectional views each showing a semiconductor device according to a fourth embodiment of the present invention.
Figure 9B:
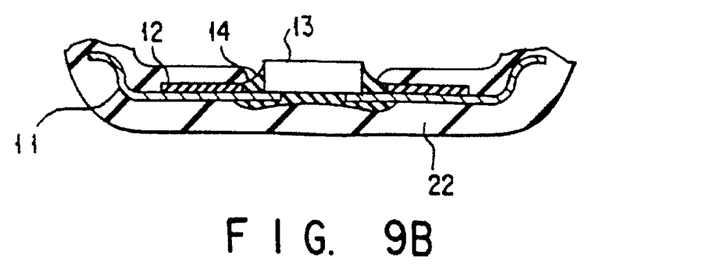
Figure 9C:
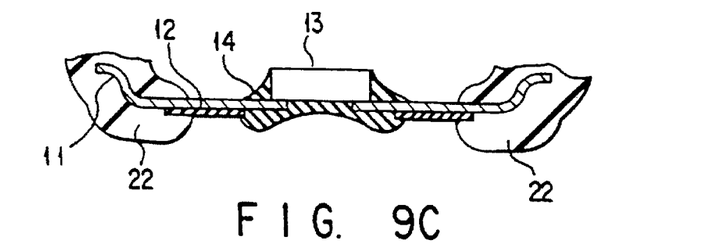

FIGS. 9A to 9C collectively show a semiconductor device according to a fourth embodiment of the present invention. The device shown in these drawings is substantially equal to the semiconductor device shown in FIGS. 4 and 5, except that, in the fourth embodiment shown in these drawings, the semiconductor chip portion A including the middle lead bonding portion is covered with a resin layer 22 so as to completely protect the semiconductor chip portion A. The resin layer 22 is formed of a material having a high resistance to humidity such as a polyimide resin.

FIGS. 9B and 9C show in detail in a magnified fashion the semiconductor chip portion A shown in FIG. 9A. To be more specific, FIG. 9B covers a case where the metal lead wire 11 is formed on one side of the carrier tape 12, which is opposite to the side of the reinforcing plate. It follows that the resin layer 22 is formed to cover the entire region of the metal lead wire 11. On the other hand, FIG. 9C covers a case where the metal lead wire 11 is formed on the other side of the carrier tape 12, which is equal to the side of the reinforcing plate. It follows that the metal lead wire 11 can be sufficiently protected, if the resin layer 22 is formed to cover the middle lead bonding portion and the vicinity thereof, because the central portion of the metal lead wire 11 is protected by the carrier tape 12.

The semiconductor device shown in FIGS. 9A to 9C exhibits a high reliability because the semiconductor chip portion A is protected by the resin layer 22.

Figure 10:
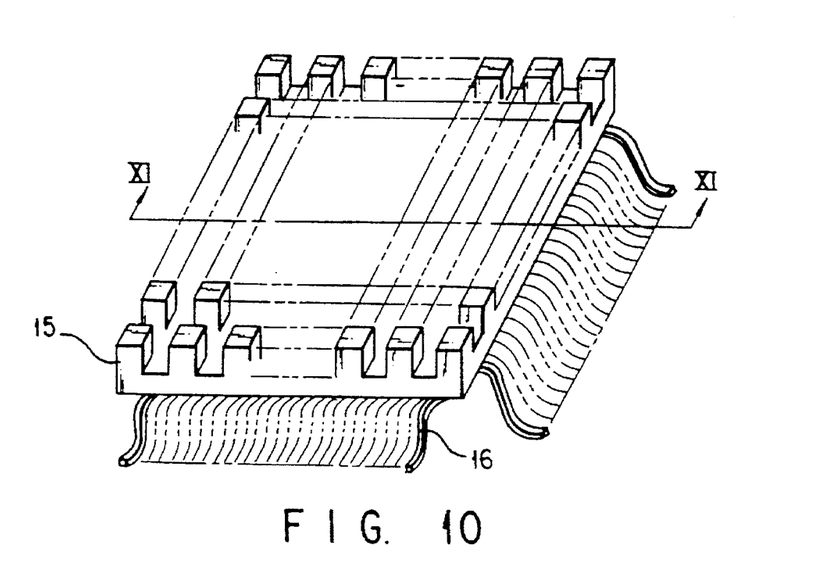
FIG. 10 is an oblique view showing a semiconductor device according to a fifth embodiment of the present invention.
Figure 11:
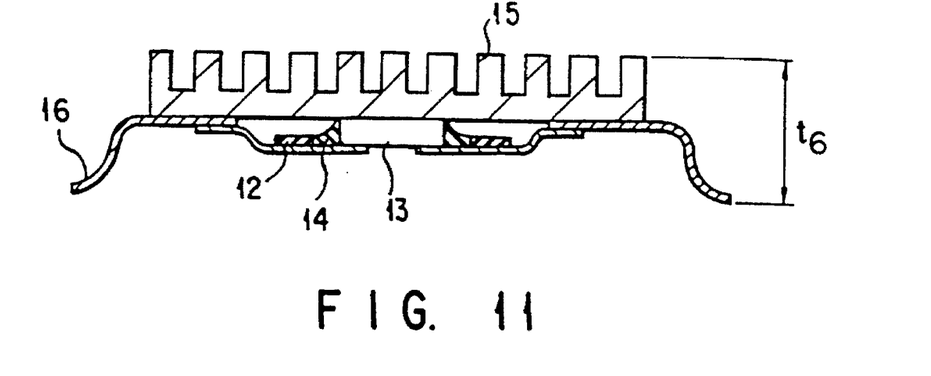
FIG. 11 is a cross sectional view along line XI—XI shown in FIG. 10.

FIGS. 10 and 11 collectively show a semiconductor device according to a fifth embodiment of the present invention, wherein FIG. 10 is an oblique view and FIG. 11 is a cross sectional view along the line XI—XI shown in FIG. 10. In the semiconductor device shown in FIGS. 10 and 11, the reinforcing plate 15 is enabled to perform a heat dissipating function. To be more specific, the reinforcing plate 15 is Joined to the heat dissipating fin 20 in the second embodiment shown in FIG. 6. In the embodiment shown in FIGS. 10 and 11, however, the reinforcing plate 15 and the heat dissipating fin 20 are formed as an integral member.

It should be noted that the semiconductor chip 13 is mounted to one surface of the reinforcing plate 15 and, thus, said one surface of the reinforcing plate 15 is flat. On the other hand, a plurality of protrusions and recesses are formed on the other surface of the reinforcing plate 15. The height of the protrusion should be determined appropriately depending on the kind of the semiconductor chip 13. In the embodiment shown in the drawings, the protrusions are arranged to from an array. However, the arrangement of the protrusions is not restricted to that shown in the drawings.

The semiconductor device shown in FIGS. 10 and 11 permits improving the thermal resistance capability to, for example, about 17° C./W in the case where the reinforcing plate 15 is formed of a copper plate, and also permits decreasing the thickness $t_6$ thereof to, for example, 3.6 mm.

Figure 12:
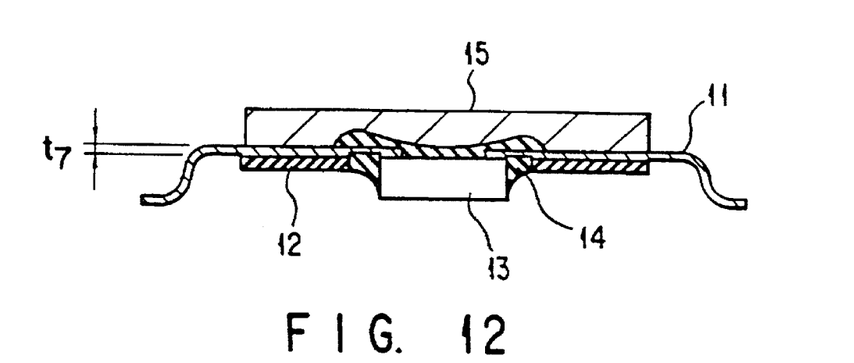
FIG. 12 is a cross sectional view showing a semiconductor device according to a sixth embodiment of the present invention.
Figure 13:
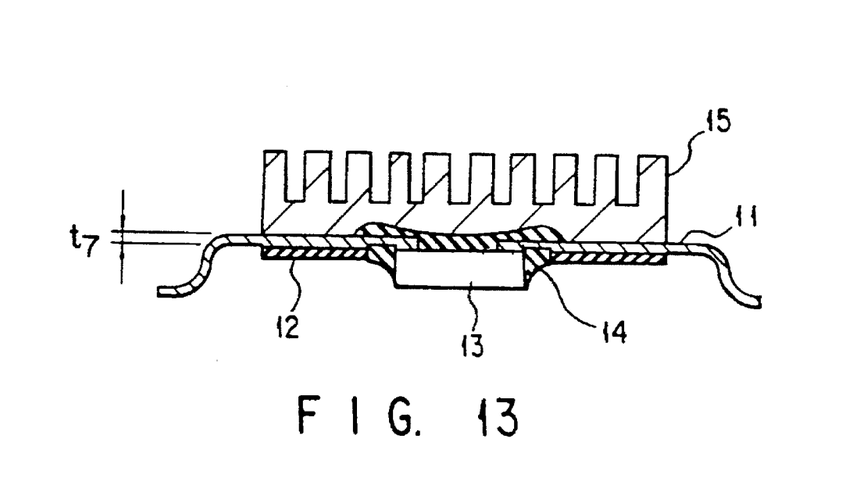
FIG. 13 is a cross sectional view showing a semiconductor device according to a seventh embodiment of the present invention.

FIGS. 12 and 13 collectively show a semiconductor device according to a sixth embodiment of the present invention. In the device shown in these drawings, the reinforcing portion B is formed of the reinforcing plate 15 alone and does not include the lead frame 16. In other words, the reinforcing plate 15 alone is mounted to the semiconductor chip portion A in this embodiment.

In the semiconductor device shown in FIGS. 12 and 13, the metal lead wire 11, preferably having a thickness $t_7$, for example, of about 3.5 µm, is brought into direct contact with, for example, a printed circuit board and, thus, is inferior to the device shown in FIGS. 4 and 5 in the resistance to a mechanical stress. However, the embodiment shown in FIGS. 12 and 13 permits making the semiconductor device thinner than the device shown in FIGS. 4 and 5.

It is possible for the reinforcing plate 15 included in the semiconductor device shown in FIG. 12 to be flat on both surfaces. When it comes to the semiconductor device shown in FIG. 13, one surface of the reinforcing plate 15 is flat, and a plurality of projections and recesses are formed on the other surface.

As described above, the present invention provides a semiconductor device in which a reinforcing plate is joined to a semiconductor device of TAB structure. A lead frame is mounted to the reinforcing plate, making it possible to provide a semiconductor device provided with a large number of pins, which facilitates the dissipation of heat generated from the semiconductor chip, permits decreasing the thickness of the device, and also permits ensuring a sufficient mechanical strength of the device. Also, a heat dissipating fin or a protective frame can be mounted to the reinforcing plate so as to manufacture a semiconductor device of a high reliability with a high yield. It is also possible to enable the reinforcing plate itself to perform the function of the heat dissipating fin. In this case, the heat dissipation from the semiconductor chip can be further improved, and the thickness of the semiconductor device can be further decreased. Further, the metal lead wire included in a semiconductor device of TAB structure can be used as an outer lead wire.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

connecting one end of a first lead wire formed on one surface of a carrier tape to a semiconductor chip;

mounting a second lead wire to one surface of a reinforcing plate having an open portion such that one end of the second lead wire is positioned in the open portion of the reinforcing plate; and connecting the other end of the first lead wire to the one end of the second lead wire by thermocompression bonding with a convex stage arranged to abut against the connecting portion between the first and second lead wires to release heat into the open portion of the reinforcing plate.

2. A method of manufacturing a semiconductor device, comprising the steps of:

connecting one end of a first lead wire formed on one surface of a carrier tape to a semiconductor chip;

mounting a second lead wire to one surface of a reinforcing plate having an open portion such that the one end of the second lead wire is positioned in the open portion of the reinforcing plate;

connecting the other end of the first lead wire to the one end of the second lead wire by thermocompression bonding with a convex stage arranged to abut against the connecting portion between the first and second lead wires to release heat into the open portion of the reinforcing plate; and mounting a protective frame to another surface of the reinforcing plate to protect the semiconductor chip, the carrier tape, and the connecting portion between the first and second lead wires.

* * * * *